(12) United States Patent
Mori

(10) Patent No.: US 9,336,890 B1
(45) Date of Patent: May 10, 2016

(54) SIMULTANEOUS PROGRAMMING OF MANY BITS IN FLASH MEMORY

(71) Applicant: Spansion LLC, Sunnyvale, CA (US)

(72) Inventor: Kaoru Mori, Tokyo (JP)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/517,201

(22) Filed: Oct. 17, 2014

(51) Int. Cl.
*G11C 16/26* (2006.01)
*G11C 16/24* (2006.01)
*G11C 7/10* (2006.01)
*G11C 7/06* (2006.01)

(52) U.S. Cl.
CPC ............... *G11C 16/26* (2013.01); *G11C 16/24* (2013.01); *G11C 7/06* (2013.01); *G11C 7/1069* (2013.01)

(58) Field of Classification Search
CPC .................................. G11C 7/1069; G11C 7/06
See application file for complete search history.

(56) References Cited

U.S. PATENT DOCUMENTS

| 5,886,937 A * | 3/1999 | Jang ..................... G11C 17/126 365/18.25 |
| 7,158,432 B1 * | 1/2007 | Hunter ................... G11C 7/065 365/189.05 |
| 2004/0223392 A1 * | 11/2004 | Ikehashi .................. G11C 7/06 365/205 |
| 2012/0057414 A1 * | 3/2012 | Park ..................... G11C 29/824 365/189.05 |
| 2014/0071745 A1 * | 3/2014 | Kawasumi ......... G11C 11/1673 365/158 |

* cited by examiner

*Primary Examiner* — Khamdan Alrobaie

(57) ABSTRACT

A semiconductor device includes: a plurality of memory cells; a plurality of local bit lines connected to respective memory cells of the plurality of memory cells; and a first amplifier. The first amplifier receives read data from each local bit line of the plurality of local bit lines and determines a transition speed of an output level of the first amplifier in response to receiving a combination of at least two pieces of read data. The first amplifier transfers, based on the determined transition speed, multivalued data of the read data to a read global bit line.

7 Claims, 12 Drawing Sheets

| LBL0-7 | LBL8-15 | n01 | n02 | SPEED OF n03 ↑ |
|---|---|---|---|---|
| 1 | 1 | 0 | 0 | 3 |
| 1 | 0 | 0 | 1 | 2 |
| 0 | 1 | 1 | 0 | 1 |
| 0 | 0 | 1 | 1 | 0 |

| SPEED OF RGBL ↓ | DSIB0 | DSIB1 | DSIB2 | NO1 | NO2 | LBL0-7 | LBL8-15 |
|---|---|---|---|---|---|---|---|
| 3 | 1 | 1 | 1 | 0 | 0 | 1 | 1 |
| 2 | 0 | 1 | 1 | 0 | 1 | 1 | 0 |
| 1 | 0 | 0 | 1 | 1 | 0 | 0 | 1 |
| 0 | 0 | 0 | 0 | 1 | 1 | 0 | 0 |

SIMULTANEOUS PROGRAMMING OF MANY BITS IN FLASH MEMORY

BACKGROUND

1. Field

The present invention generally relates to a semiconductor device and a method for transferring data.

2. Background

Several types of mechanisms for writing flash memory are conventionally available. For example, in n-channel floating-gate flash memory, data is written by accumulating, on the floating gate, channel hot electrons generated by causing a current to flow between the drain and the source.

In p-channel floating-gate flash memory, data is written by band-to-band tunneling, and so the current flowing through each cell during a write is very small, (e.g., 10 nA per bit.) The current flowing through each cell is hereafter also referred to as "cell current."

FIG. 1 is a diagram showing an example of the schematic structure of the p-channel floating-gate flash memory. For example, in the case where 1024 bits of memory cells are connected to one word line, the total cell current to write the memory cells corresponding to one word line at once is a mere 10 ρA. An internal boost power supply included in the flash memory is enough to supply 10 μA. Each SSEL shown in FIG. 1 is a transistor for selecting a local bit line (LBL).

Thus, the p-channel floating-gate flash memory enables a large amount of data to be written faster, by batch writing of multiple bits through use of the above-mentioned feature (for example, WO2006/038250, JP2003-85989 A). There is also a semiconductor integrated circuit that increases the reading speed for a hierarchized bit line structure in an on-chip nonvolatile memory (for example, JP2004-318941 A).

SUMMARY

In the case of batch writing of multiple bits in flash memory, the bit width that can be written at once is determined by the number of global bit lines (GBLs) for transmitting data input from outside the flash memory to memory cells and the number of amplifiers (hereafter also referred to as "2nd amp") for driving the GBLs, as shown in FIG. 1. In the memory shown in FIG. 1, for example, 128 cells equal in number to the GBLs and the 2nd amps can be written simultaneously.

FIG. 2 is a diagram showing a structural example of local sense amplifiers and bit lines in the flash memory. A hierarchized bit line structure in which one of a plurality of local bit lines LBL0 to LBL7 arranged in a sector is selected and connected to one GBL common to a plurality of sectors is used in the example shown in FIG. 2.

In the example shown in FIG. 2, one GBL is not commonly used for read and write, but is separated into a read GBL (RGBL) and a write GBL (WGBL).

Accordingly, the capacitance of the RGBL can be reduced to achieve faster read, or the resistance of the WGBL can be reduced to reduce a voltage drop until a write voltage reaches a cell.

In the case of reading data stored in a cell, data of an LBL with low parasitic capacitance is amplified by a sense amplifier that includes a local sense amplifier (local S/A), a NOR circuit, and an NMOS gate adjacent to the sector. The data is then transmitted to the GBL. The flash memory thus employs a local sense amplifier system for faster read of cell data.

A structure in which one local S/A and a total of two GBLs, that include one WGBL and one RGBL, correspond to eight LBLs as illustrated in FIG. 2. In this example, the transistor capacitance load connected to the read path includes the junction capacitance of eight SSELs and one read gate (hereafter referred to as "SRD"), and the gate oxide capacitance of one SSEL and one SRD gate.

To further increase the number of bits that can be written at once in rewritable nonvolatile memory such as p-channel floating-gate flash memory, the number of GBLs and the number of local S/As need to be increased, as mentioned above.

For instance, consider an example in which the number of bits that can be written at once is doubled by doubling the number of GBLs and the number of local S/As for the LBLs. FIG. 3 is a diagram showing another example of local sense amplifiers and bit lines in the flash memory. Four GBLs and two local S/As correspond to eight LBLs. In the example shown in FIG. 3, the cell wiring area and the sense amplifier area are increased as compared with the example illustrated in FIG. 2.

If the number of bits that can be written at once is further increased in the same manner, the number of GBLs and the number of local S/As become excessively large, and these components cannot be arranged in the cell array. Thus, there is a problem in that an increase in the number of bits that can be written at once involves an increase in area of data buses or local S/As.

This problem is not limited to flash memory. For example, in nonvolatile memory with a smaller memory cell area such as a phase change RAM (PCRAM) or a resistive RAM (ReRAM), the area of data buses or S/As affects the chip size more significantly.

A disclosed technique may be used to prevent an increase in device area in a semiconductor device that enables batch writing of multiple bits.

According to an embodiment, a semiconductor device according to the disclosed technique includes: a plurality of memory cells; a plurality of local bit lines connected to respective memory cells of the plurality of memory cells; and a first amplifier. The first amplifier receives read data from each local bit line of the plurality of local bit lines and determines a transition speed of an output level of the first amplifier in response to receiving a combination of at least two pieces of read data. The first amplifier transfers, based on the determined transition speed, multivalued data of the read data to a read global bit line.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

DESCRIPTION

Figure 1:
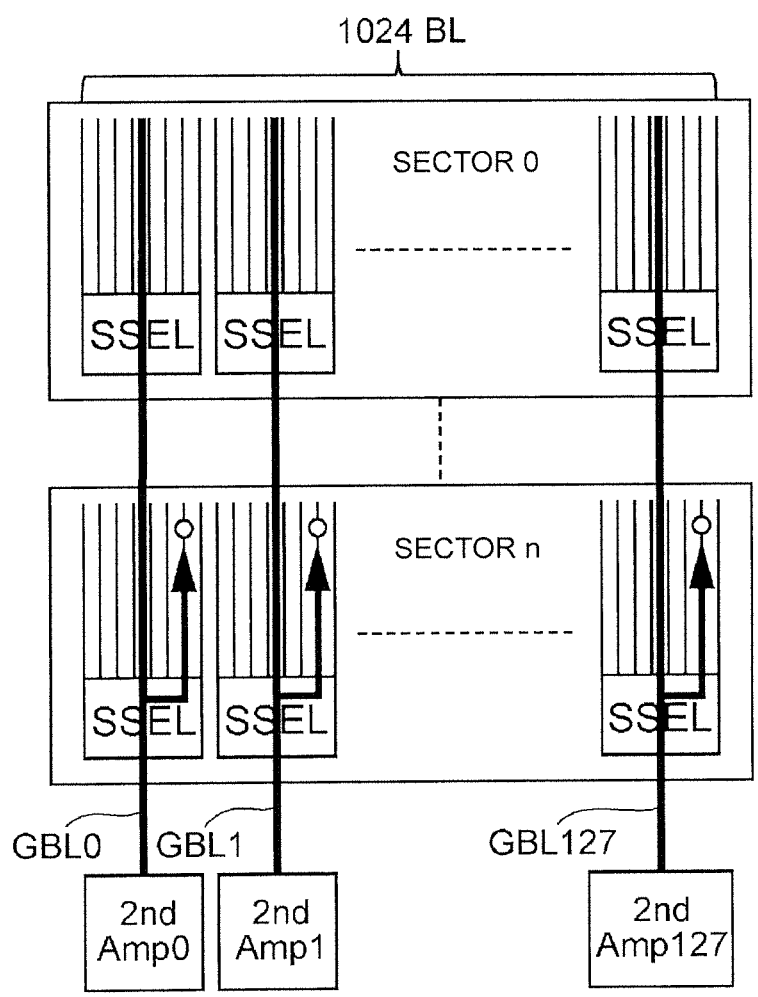
FIG. 1 is a diagram showing an example of the schematic structure of p-channel floating-gate flash memory.
Figure 2:
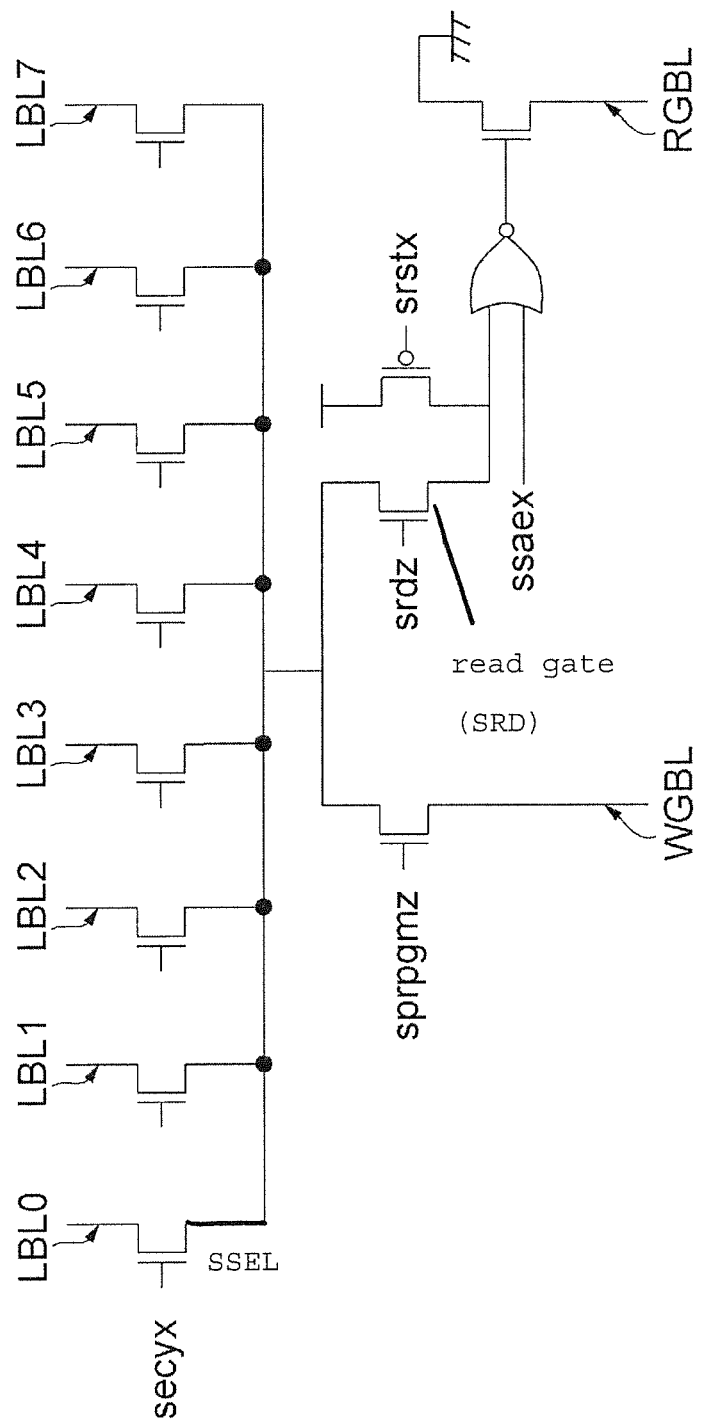
FIG. 2 is a diagram showing a structural example of local sense amplifiers and bit lines in the flash memory.

In the following detailed description, reference is made to the accompanying drawings, which form a part hereof. In the drawings, similar symbols typically identify similar components, unless context dictates otherwise. Further, the drawings are intended to be explanatory and may not be drawn to scale. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

In other words, the following embodiments are illustrated for describing the present invention, and the present invention is not limited to the embodiments. Furthermore, the present invention can be modified in various ways insofar as they do not deviate from the scope of the invention. Moreover, a positional relation such as up, down, left and right may be based on the positional relation as is illustrated in the drawings, unless otherwise specifically indicated. A dimensional ratio in the drawings is not limited to the shown ratio. The following describes an embodiment of a semiconductor device with reference to drawings.

(Overall Structure)

Figure 4:
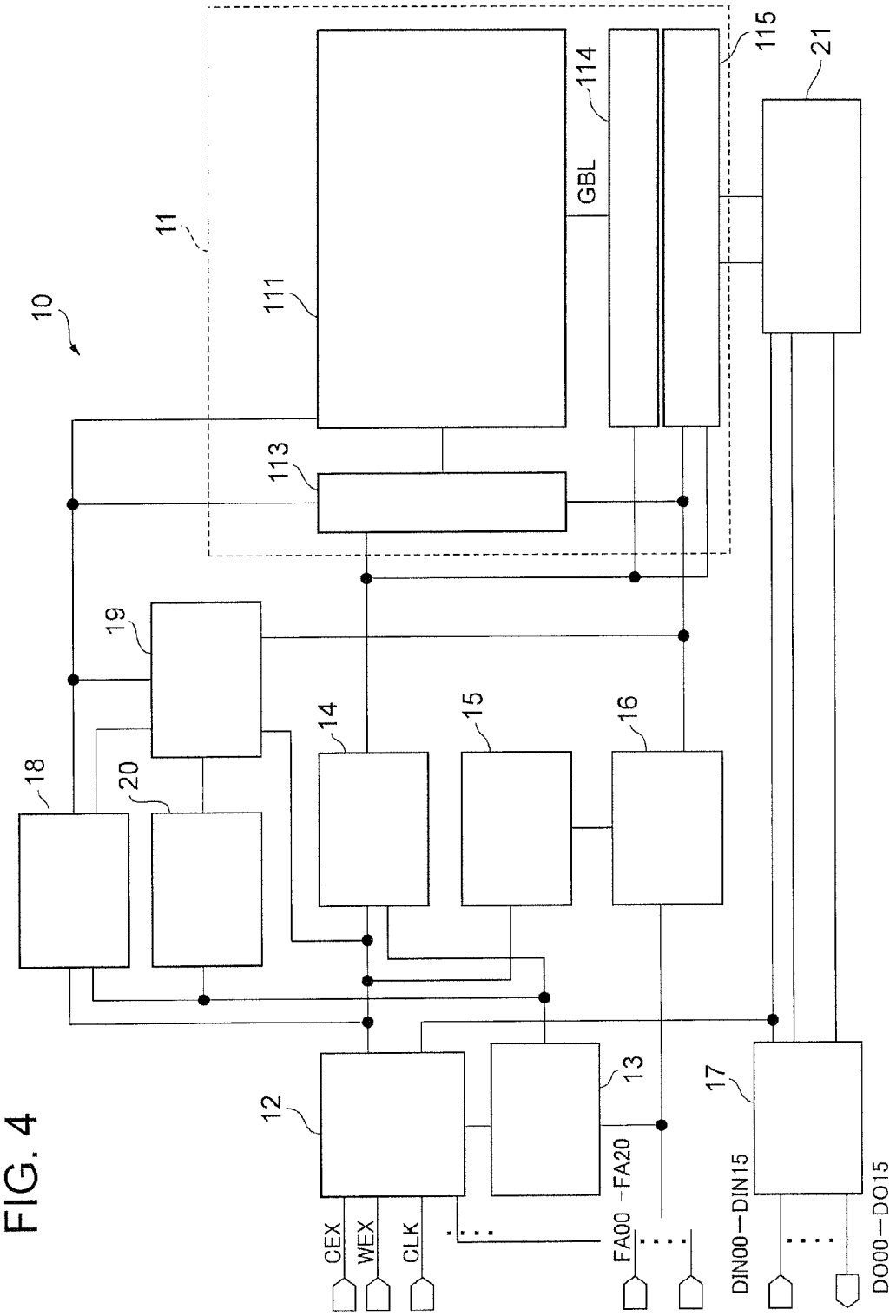
FIG. 4 is a diagram showing an example of a semiconductor device in an embodiment.

FIG. 4 is a diagram showing an example of a semiconductor device in an embodiment. A semiconductor device 10 shown in FIG. 4 is flash memory, as an example. Semiconductor device 10 includes a memory core 11, a command generation circuit 12, a test mode control circuit 13, an operation control circuit 14, an address controller 15, an address generation circuit 16, and a data input/output circuit 17. Semiconductor device 10 also includes an internal voltage generation circuit 18, a content addressable memory (CAM) 19, a CAM access control circuit 20, and a bus control circuit 21.

Memory core 11 includes a memory cell array 111, an X control circuit 113, a Y control circuit 114, and a read/write amplifier 115.

Memory cell array 111 has a plurality of cells arranged in a matrix. Memory cell array 111 includes a memory cell array for redundancy.

The X control circuit 113 applies a predetermined voltage to a gate of each cell and the like in the memory cell array 111, according to a row address generated by the address generation circuit 16 and a control signal from the operation control circuit 14, according to an embodiment.

The Y control circuit 114 and the read/write amplifier 115 apply a predetermined voltage to a bit line of each memory cell in the memory cell array 111 to perform a read operation or a write operation, according to a column address generated by the address generation circuit 16 and the control signal from the operation control circuit 14, according to an embodiment.

The command generation circuit 12 is connected to external terminals CEX, WEX, and CCK and an address terminal ADD. The command generation circuit 12 determines a read command, a write command, an erase command, a test mode, or the like, according to a chip enable signal, a write enable signal, a clock signal, and an address input from these terminals, according to an embodiment.

The test mode control circuit 13 executes a write test, a read test, an erase test, or the like, according to the test mode designated by the command generation circuit 12, according to an embodiment.

The operation control circuit 14 generates the control signal for the memory core 11 and supplies the control signal to the X control circuit 113, the Y control circuit 114, and the read/write amplifier 115, according to the command generated by the command generation circuit 12 or the signal from the test mode control circuit 13, according to an embodiment.

The address controller 15 controls an internal address (column address and row address) generated by the address generation circuit 16, according to the command generated by the command generation circuit 12 or the signal from the test mode control circuit 13, according to an embodiment.

The address generation circuit 16 receives input of an external address from address terminals FA00 to FA20 and the like, and generates the internal address according to the instruction from the address controller 15.

The data input/output circuit 17 is connected to input/output terminals IO, and outputs data read from the memory cell array 111 or receives input of data to be written to the memory cell array 111, according to an embodiment. Though a plurality of input/output terminals IO are present, they are omitted in the drawing.

The internal voltage generation circuit 18 generates various internal voltages and supplies the internal voltages to the CAM 19, the X control circuit 113, and the memory cell array 111, according to the command generated by the command generation circuit 12 or the control signal supplied from the test mode control circuit 13, according to an embodiment.

The CAM 19 holds an address of any redundant defective cell. The CAM access control circuit 20 controls, for example, write access or read access to the CAM 19, based on the control signal from the test mode control circuit 13, according to an embodiment.

The bus control circuit 21 is connected between the data input/output circuit 17 and the read/write amplifier 115, and controls data flowing through the bus control circuit 21.

A flash cell with a small cell current during write per bit, such as a p-channel floating-gate cell, may be used as each cell of the flash memory. The number of WGBLs may be increased for batch writing of multiple bits, and multivalued data may be transferred in each RGBL, where an amplifier suitable for transferring multivalued data and a circuit for generating multivalued data read timings are provided, according to an embodiment.

According to an embodiment, an amplifier common to a plurality of local bit lines transfers multivalued data of read data to an RGBL using a transition time of output level of the RGBL in response to a combination of the plurality of local bit lines. The number of GBLs connecting the memory cell array 111 and the Y control circuit 114 can be reduced in this way. The following describes an example structure for reducing the number of GBLs.

(Structure of Memory Cell Array and its Peripheral Circuits)

Figure 5:
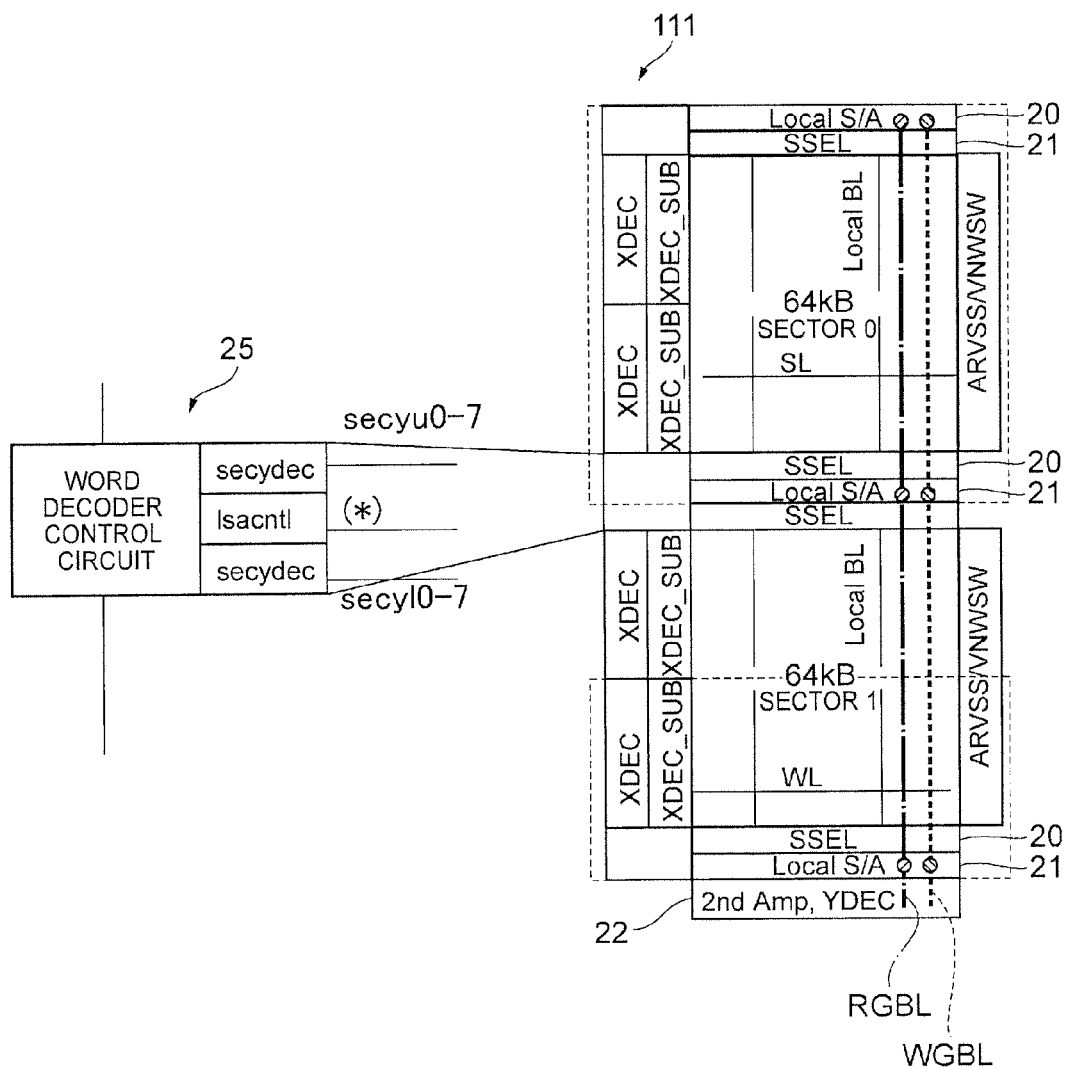
FIG. 5 is a diagram showing an example of the structure of a memory cell array and its peripheral circuits in an embodiment.

FIG. 5 is a diagram showing an example of the structure of the memory cell array 111 and its peripheral circuits in an embodiment. In the example shown in FIG. 5, the sector size is 64 kB, and a two-sector structure of sectors 0 and 1 is used for simplicity's sake. However, the sector size and the number of sectors are not limited to such.

An XDEC (X decoder), an XDEC_SUB, an LBL, a local S/A (sense amplifier) 21, an SSEL (sector selector) 20, a 2nd amp, YDEC (hereafter also simply referred to as "2nd amp") 22, an RGBL, a WGBL, an ARVSS, and a VNWSW are arranged around the memory cell array 111. Here, the local S/A 21 is a first amplifier, and the 2nd amp 22 is a second amplifier.

The XDEC decodes a word line. The XDEC_SUB drives the word line. The LBL is a data bus for reading data from or writing data to a memory cell.

The SSEL 20 selects a sector. The local S/A 21 is adjacent to the SSEL 20, and amplifies LBL data. The local S/A 21 also transfers multivalued data to the RGBL, using a difference in output level transition speed, according to an embodiment.

The RGBL transmits the data amplified by the local S/A 21, to the 2nd amp 22. The WGBL transmits write data from the 2nd amp 22 to the local S/A 21. The 2nd amp 22 determines the difference in output level transition speed of the RGBL, and converts multivalued data to binary data, according to an embodiment.

The ARVSS decodes and drives a source line (SL) in the cell array, on a sector basis. The VNWSW decodes and drives an N-well of a cell, on a sector basis.

Circuits such as a word decoder control circuit, a secydec, and a lsacntl are arranged in a portion 25 where the SSEL, the local S/A, the XDEC, and the XDEC_SUB cross each other. The word decoder control circuit generates a word decoder control signal group including control signals for the XDEC and the XDEC_SUB. The lsacntl generates sprpgmu0z to sprpgmu3z and sprpgml0z to sprpgml3z, srdu0z to srdu3z and srdl0z to srdl3z, srstx, and ssae0x to ssae3x which are control signals for the local S/A 21. The secydec generates secyu0 to secyu7 and secyl0 to secyl7 which are control signals for the SSEL 20. For example, a ½ sector area is activated during read, and one whole sector is activated during program/erase. These control signals are illustrated, for example, in FIG. 6.

(Structure of Memory Cell Array, SSEL, and Local S/A)

Figure 6:
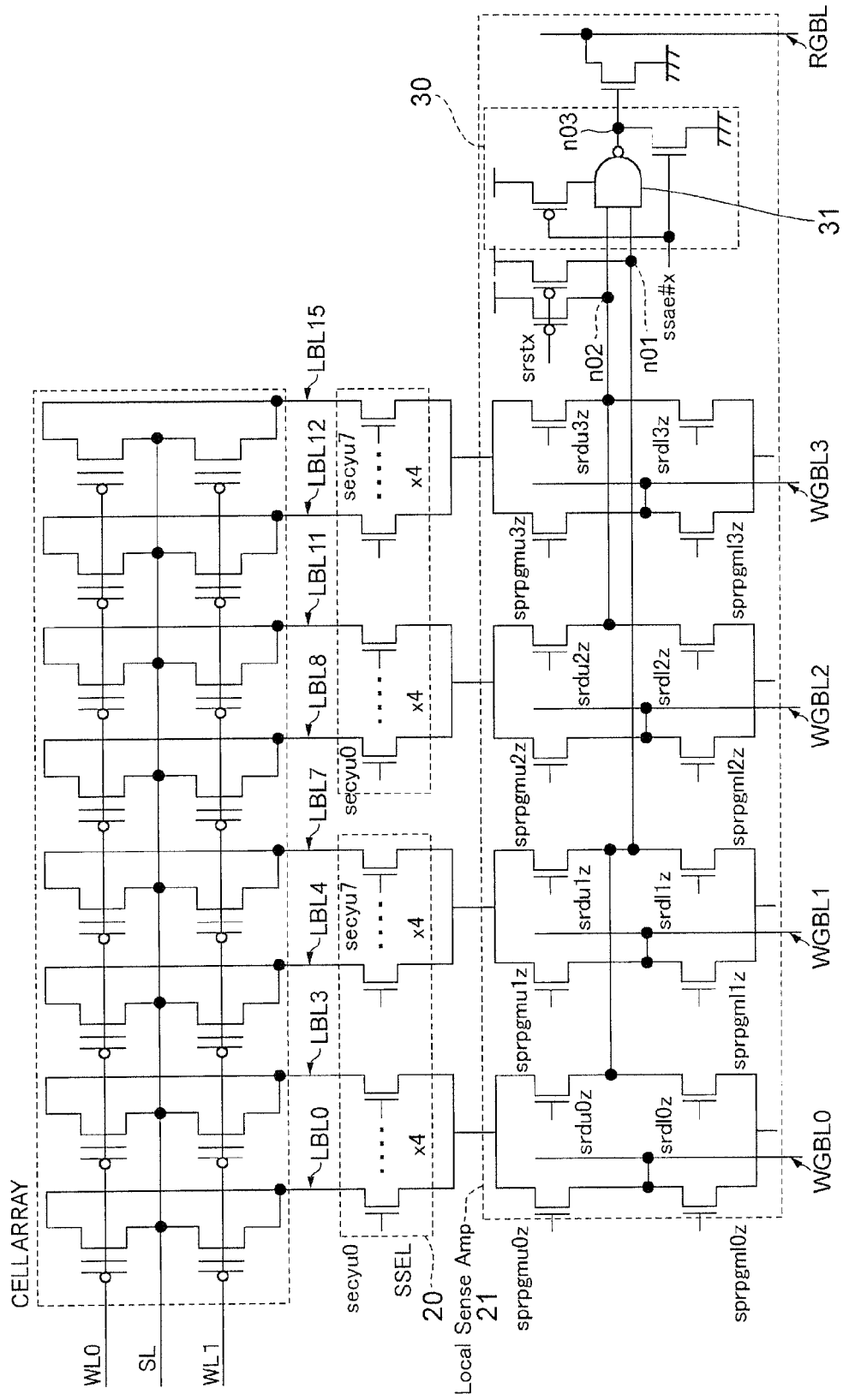
FIG. 6 is a diagram showing an example of the structure of a memory cell array, an SSEL, and a local S/A in an embodiment.

FIG. 6 is a diagram showing an example of the structure of the memory cell array 111, the SSEL 20, and the local S/A 21 in an embodiment. In the example shown in FIG. 6, four WGBLs are arranged to double the number of bits that can be written at once as compared with the circuit shown in FIG. 3, whereas the number of RGBLs is one.

The SSEL 20 selects one of eight LBLs according to the control signals secyu0 to secyu7 and secyl0 to secyl7, and connects the LBL to the local S/A 21. The local S/A 21 is shared between adjacent two sectors.

The control signals sprpgmu0z to sprpgmu3z and sprpgml0z to sprpgml3z are all at a logical low level during standby, and the control signals for the selected sector are at a logical high level during read/write. The logical low level of the control signals sprpgmu0z to sprpgmu3z and sprpgml0z to sprpgml3z indicates an off state, and the logical high level of the control signals sprpgmu0z to sprpgmu3z and sprpgml0z to sprpgml3z indicates an on state, according to an embodiment.

The control signals srdu0z to srdu3z and srdl0z to srdl3z are all at a logical high level during standby, the control signals for the unselected sector are at a logical low level during read, and the control signals for both sectors are at a logical low level during write/erase, according to an embodiment. The logical high level of the control signals srdu0z to srdu3z and srdl0z to srdl3z indicates an on state, and the logical low level of the control signals srdu0z to srdu3z and srdl0z to srdl3z indicates an off state.

The control signal srstx is at a logical low level during standby and write/erase, where the control signal indicates an on state to connect a node n01 and a node n02 to vdd, according to an embodiment. The control signal srstx is at a logical high level during read. The logical low level of the control signal srstx indicates an on state, and the logical high level of the control signal srstx indicates an off state.

During read, LBL data passes through an SRD gate and reaches an input of a composite gate 30. LBLs 0 to 7 correspond to the node n01, and LBLs 8 to 15 correspond to the node n02. The drive capability of the composite gate 30 is based on the drive capability of a gate receiving element in a NAND circuit 31.

Figures 7, 8:
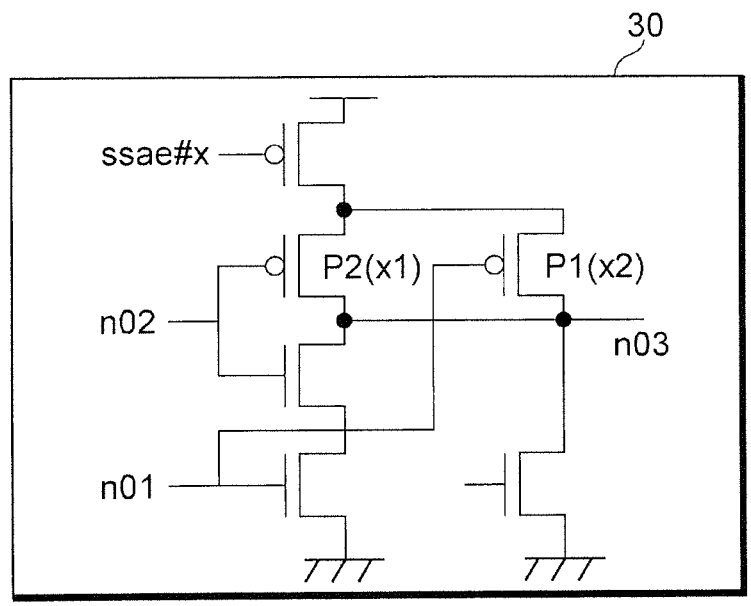
FIG. 7 is a diagram showing an example of the structure of a composite gate in an embodiment.
FIG. 8 is a diagram showing an example of the speeds at which a node n03 changes from L level to H level.

FIG. 7 is a diagram showing an example of the structure of the composite gate 30 in an embodiment. In the example shown in FIG. 7, the drive capability of a p-channel transistor P1 that receives the node n01 at its gate is twice the drive capability of a p-channel transistor P2 that receives the node n02 at its gate.

When data is output from the nodes n1 and n02, any of the control signals ssae0x to ssae3x becomes a logical low level. As a result, a node n03 assumes one of four states that are: respective states of changing from logical low level to logical high level at three different speeds s1, s2, and s3; and a state of maintaining a logical low level, according to the combination of the values of the nodes n01 and n02, according to an embodiment.

FIG. 8 is a diagram showing an example of the speeds at which the node n03 changes from a logical low to a logical high level (represented as "node n03↑"). In the example shown in FIG. 8, when the cell data of the LBLs 0 to 7 is a logical high level (1) and the cell data of the LBLs 8 to 15 is a logical high level (1), the node n01=L(0) and the node n02=L(0) when the control signal ssaex=L. Hence, the speed at which the node n03 changes from a logical low level to a logical high level is the speed s3 (=s1×3). The speed of changing from a logical low to a logical high level is hereafter also referred to as "output level transition speed." Reflecting this, the speed at which the RGBL changes from a logical high to a logical low level is three times the reference speed, according to an embodiment.

When the cell data of the LBLs 0 to 7 is a logical high level (1) and the cell data of the LBLs 8 to 15 is a logical low level (0), the node n01=L(0) and the node n02=H (1) when the control signal ssaex=L. Hence, the output level transition speed of the node n03 is the speed s2 (=s1×2). Reflecting this, the speed at which the RGBL changes from a logical high to a logical low level is twice the reference speed, according to an embodiment.

When the cell data of the LBLs 0 to 7 is a logical low level (0) and the cell data of the LBLs 8 to 15 is a logical high level (1), the node n01=H (1) and the node n02=L(0) when the control signal ssaex=L. Hence, the output level transition speed of the node n03 is the speed s1. Reflecting this, the speed at which the RGBL changes from a logical high to a logical low level is the reference speed, according to an embodiment.

When the cell data of the LBLs 0 to 7 is a logical low level (0) and the cell data of the LBLs 8 to 15 is a logical low level (0), the nodes n01 and n02 are both H level (1). Hence, the node n03 maintains a logical low level (0), and the RGBL maintains a logical high level (1).

As described above, the local S/A 21 includes the NAND circuit 31 that receives input from two or more local bit lines, and determines the output level transition speed based on the combination of the read data and the difference between the drive abilities of the elements of the NAND circuit 31 that receive the respective local bit lines at their gates, according to an embodiment.

Thus, multivalued data is transferred to the RGBL during read or verify, using the difference in output level transition speed. The number of RGBLs may be reduced accordingly. Note that, since only the number of WGBLs is increased to write multiple bits at once, the same number of bits of data may not be verified at once during verify after write.

The influence of this can be suppressed in the following manner: verify is performed twice by incrementing a column address to be written in one write while a word line (WL) is kept in a selected state, given that verify has a long wait time for stabilization after WL voltage boost, according to an embodiment.

(Second Amplifier)

Figure 9:
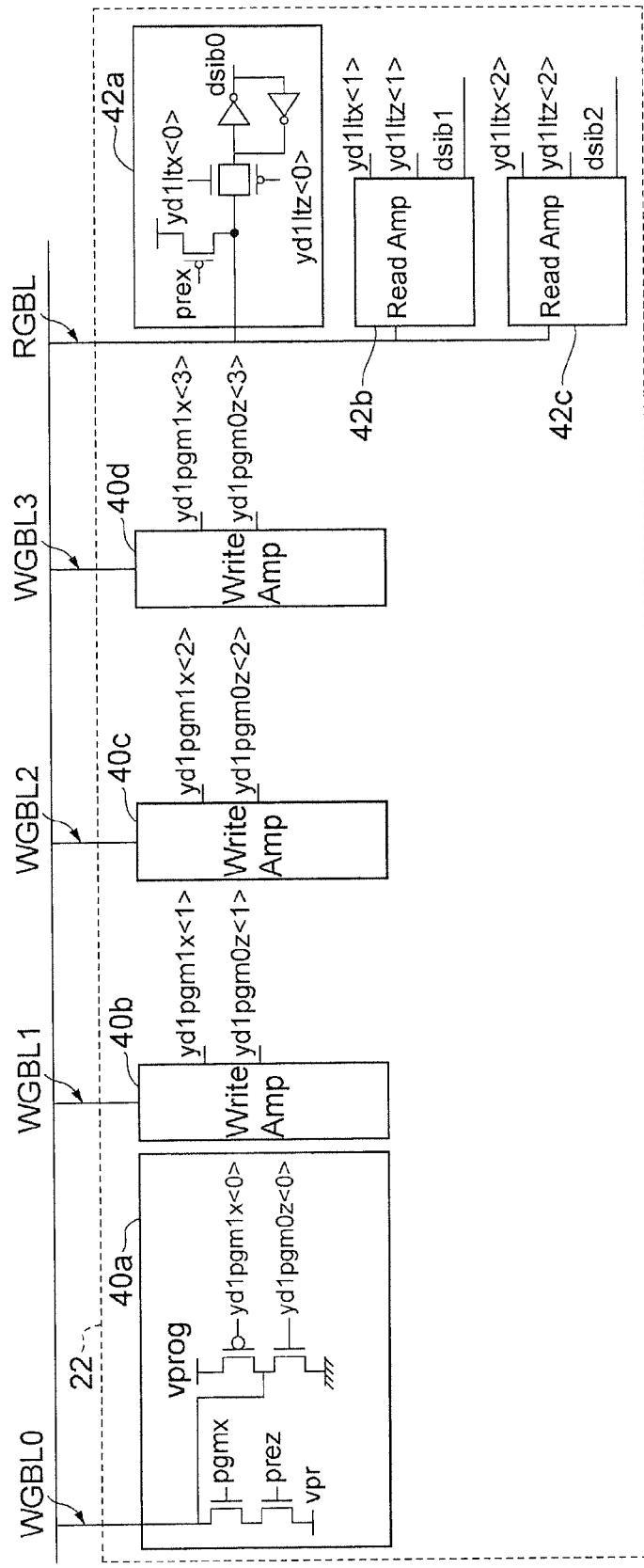
FIG. 9 is a diagram showing an example of the structure of a 2nd amp in the embodiment.

FIG. 9 is a diagram showing an example of the structure of the 2nd amp 22 in an embodiment. In the example shown in FIG. 9, write amplifiers 40*a* to 40*d* are provided for the respective WGBLs, and read amplifiers 42*a* to 42*c* are provided for the RGBL.

In the 2nd amp 22, the RGBL is precharged to a logical high level=vdd=1.2 V during standby. In the 2nd amp 22, the RGBL is stopped being precharged and caused to be floating during a read.

Figures 10, 11:
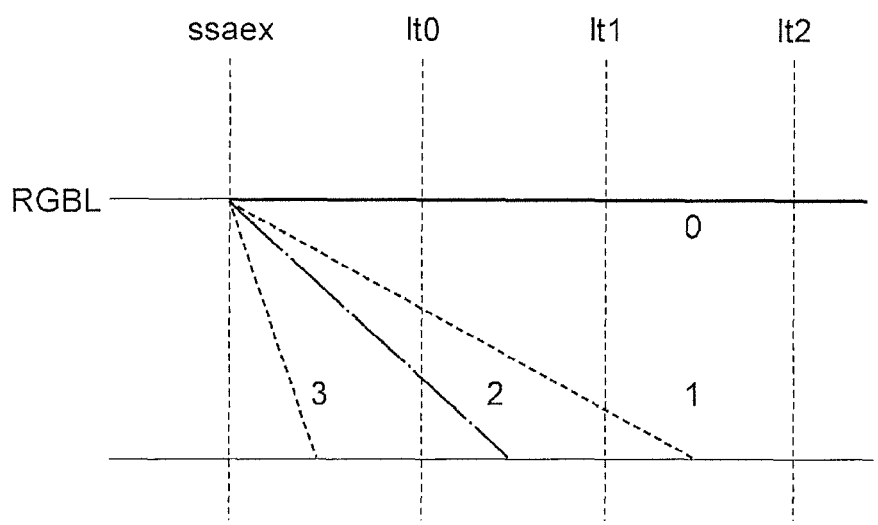
FIG. 10 is a diagram for describing differences in speed at which an RGBL falls from H level to L level.
FIG. 11 is a diagram showing an example of a table of conversion from multivalued data to binary data.

FIG. 10 is a diagram for describing differences in speed at which the RGBL falls from a logical high to a logical low level. In the example shown in FIG. 10, the read amplifiers 42*a* to 42*c* perform sensing by determining the differences in speed at which the RGBL falls from a logical high to a logical low level. The speed at which the RGBL falls from a logical high to a logical low level is hereafter also referred to as "RGBL transition speed."

In the example shown in FIG. 10, for instance, the read amplifiers 42*a* to 42*c* perform sensing at different timings It0, It1, and It2, starting from the control signal ssaex which triggers the start of fall of the RGBL, according to an embodiment.

In the case where the RGBL transition speed is s3, RGBL=L at the timing It0. Accordingly, the three read amplifiers 42*a* to 42*c* all retrieve data of RGBL=L.

In the case where the RGBL transition speed is s2, the RGBL is determined as a logical high level at the timing It0, but determined as a logical low level at the timings It1 and It2. Accordingly, the read amplifiers 42*b* and 42*c* which perform sensing at the timings It1 and It2 receive RGBL=L.

Likewise, in the case where the RGBL transition speed is s1, the read amplifier 42*c* receives RGBL=L at the timing It2.

In the case where the RGBL maintains am logical high level, RGBL=H even at the timing It2. Accordingly, the read amplifiers 42*a* to 42*c* all receive RGBL=H.

As described above, the read amplifiers 42*a* to 42*c* distinguish four types of data by performing sensing at three timings. By identifying the RGBL transition speed in this way, the 2nd amp 22 can convert multivalued data to binary data, according to an embodiment. The RGBL transition speed is also referred to as "transfer speed," from the viewpoint that multivalued data is transferred.

FIG. 11 is a diagram showing an example of a table of conversion from multivalued data to binary data. In the example shown in FIG. 11, when the values received by the read amplifiers 42*a* to 42*c* are respectively dsib0=1, dsib1=1, and dsib2=1, the 2nd amp 22 determines that the RGBL transition speed is s3. The values of the nodes n01 and n02 corresponding to the RGBL transition speed s3 are both 0, and the cell data of the LBLs 0 to 7 is 1 and the cell data of the LBLs 8 to 15 is 1.

In the same manner, the 2nd amp 22 determines the multivalued data of the RGBL and the binary data of the LBLs from the values received by the read amplifiers 42*a* to 42*c* based on the table shown in FIG. 11. The 2nd amp 22 thus encodes the multivalued data to the binary data, by detecting the difference in RGBL transition speed.

Referring back to FIG. 9, the write amplifiers 40*a* to 40*d* are used to apply vpr to the WGBLs during standby and read, and used to precharge the LBLs to vpr before sensing during read, according to an embodiment.

Each WGBL is set to L=vss when writing data 0, and H=vprog when not writing data 0. Each WGBL maintains vpr during erase. Upon high voltage discharge after erase, vprog is once re-connected to vdd to discharge high voltage to vdd, in order to discharge the high voltage of the bit line from the GBL, according to an embodiment.

(Example of Operation Waveforms)

Figure 12:
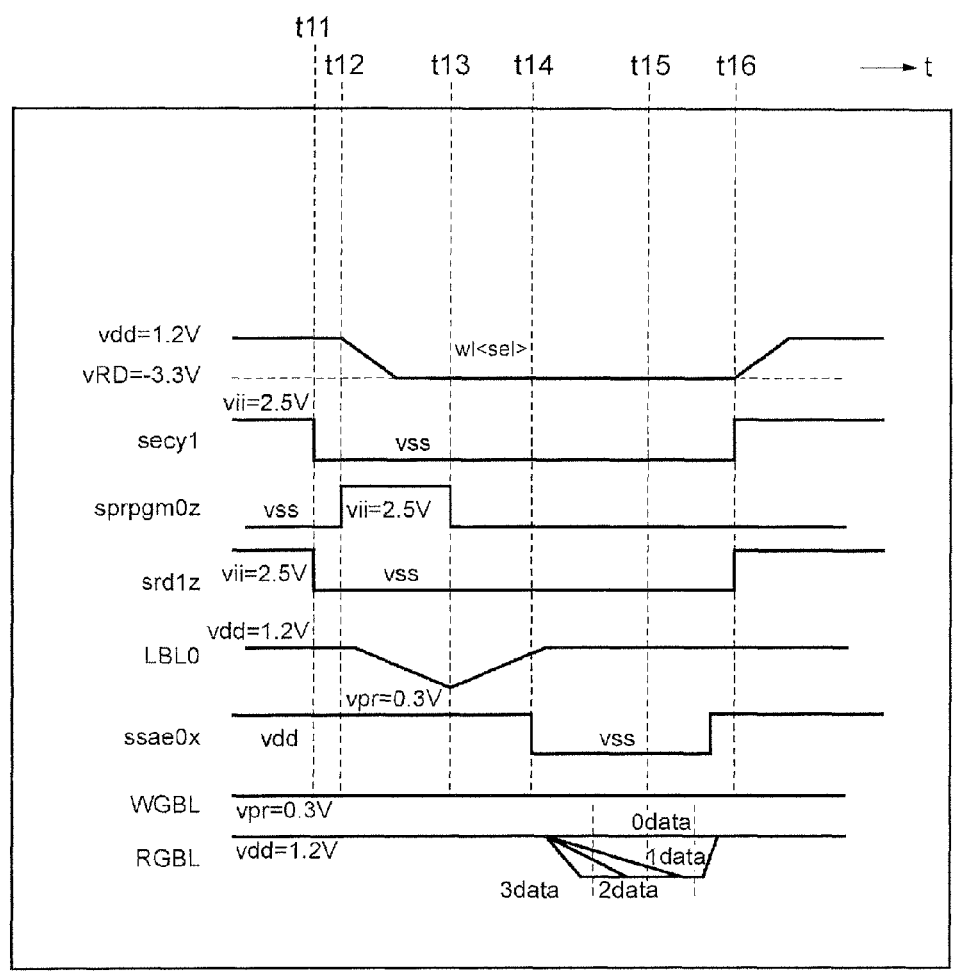
FIG. 12 is a diagram showing an example of read/verify operation waveforms in an embodiment.

The following describes an example of each operation waveform in an embodiment. FIG. 12 is a diagram showing an example of read/verify operation waveforms. The following describes the verify operation waveform example shown in FIG. 12, separately at timings t11 to t16.

t11: The control signals srd1*z* and secy1 are selected (the unselected side becomes a logical low level).

t12: LBL precharge starts, and the WL is selected.

t13: LBL precharge ends. In the case of data 0, discharge starts in the LBL with a cell current.

t14: LBL discharge ends, and sensing starts with the control signal ssae0*x*=L. Discharge starts in the RGBL, except in the case where cell data=00 (=0).

t15: In a stage when the RGBL discharge has progressed, the 2nd amp 22 latches data at the respective timings It0, It1, and It2. The 2nd amp 22 encodes cell data based on the latched RGBL data, and outputs the encoded data, according to an embodiment. After the data latch, ssaex and the RGBL are reset.

t16: The WL is reset, and srd1*z* and secy1 are unselected. That is, the unselected side becomes a logical high level.

The timings at which the 2nd amp 22 latches data may be appropriately set based on the application.

In an embodiment, the number of WGBLs is larger than the number of RGBLs so that multiple bits can be written at once. Therefore, during verify, data corresponding to the bit width that can be written at once using the WGBLs cannot be read at once using the RGBL. The verify process may instead be performed by separately reading the written bits a plurality of times using the RGBL. The verify process in this case is carried out by repeatedly performing, on the same WLs as when writing multiple bits, the process from the start of the LBL precharge in t12 to the end of the encode process in t15. The process may be performed a number of times equal to the number of bits written.

In the verify process, the selection of the WL in t12 and the WL reset operation in t16 take time. Accordingly, repeatedly performing the process from the start of the LBL precharge in t12 to the end of the encode process in t15 does not significantly affect the verify time.

Figure 13:
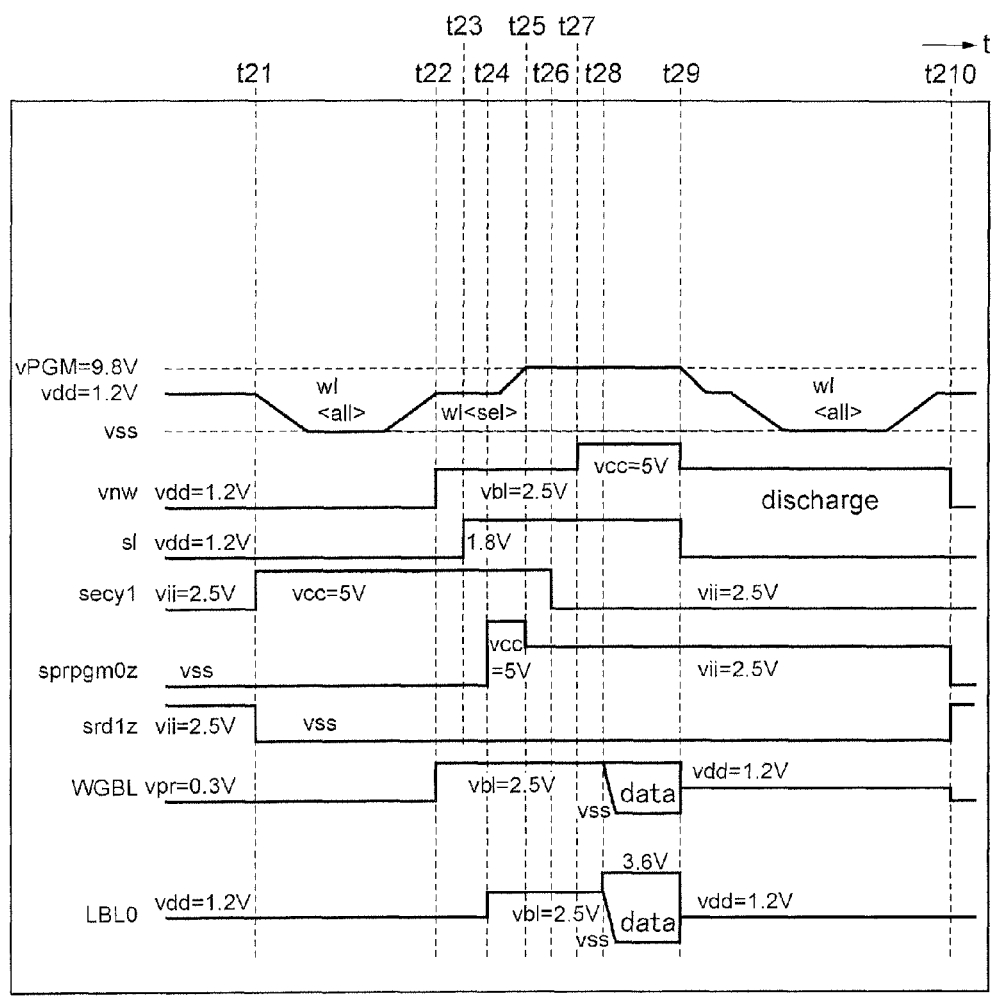
FIG. 13 is a diagram showing an example of write operation waveforms in an embodiment.

FIG. 13 is a diagram showing an example of write operation waveforms. The following describes the write operation waveform example shown in FIG. 13, separately at timings t21 to t210, according to an embodiment.

t21: The selected word line is set to vdd. Simultaneously, srdz is closed, and secy1 is set to vcc (5.6 V), to prepare for BL precharge.

t22: vnw (N-well) is boosted to 2.5 V.

t23: sl (source line) is boosted from 1.2 V to 1.8 V.

t24: sprpgm0z is opened, BL precharge starts (2.5 V), and the word line write voltage rises from 5 V to 10 V.

t25: The selected sprpgm0z is changed from vcc=5.6 V back to vii=2.5 V, and the charge of the LBL is trapped.

t26: secy1 is changed from vcc=5.6 V to vii=2.5 V, and the charge of the selected LBL is trapped.

t27: vnw (N-well) is increased from 2.5 V to 5 V. As a result, the voltage of the LBL increases by coupling from the well.

t28: The selected WGBL and LBL are connected to vss, to start the program.

t29: When the program ends, the word line is reset in the reverse order of t21 to t25. The well is discharged to vii=2.5 V, and the sl and the LBL are discharged to vdd=1.2 V.

t210: Return to standby.

Figure 14:
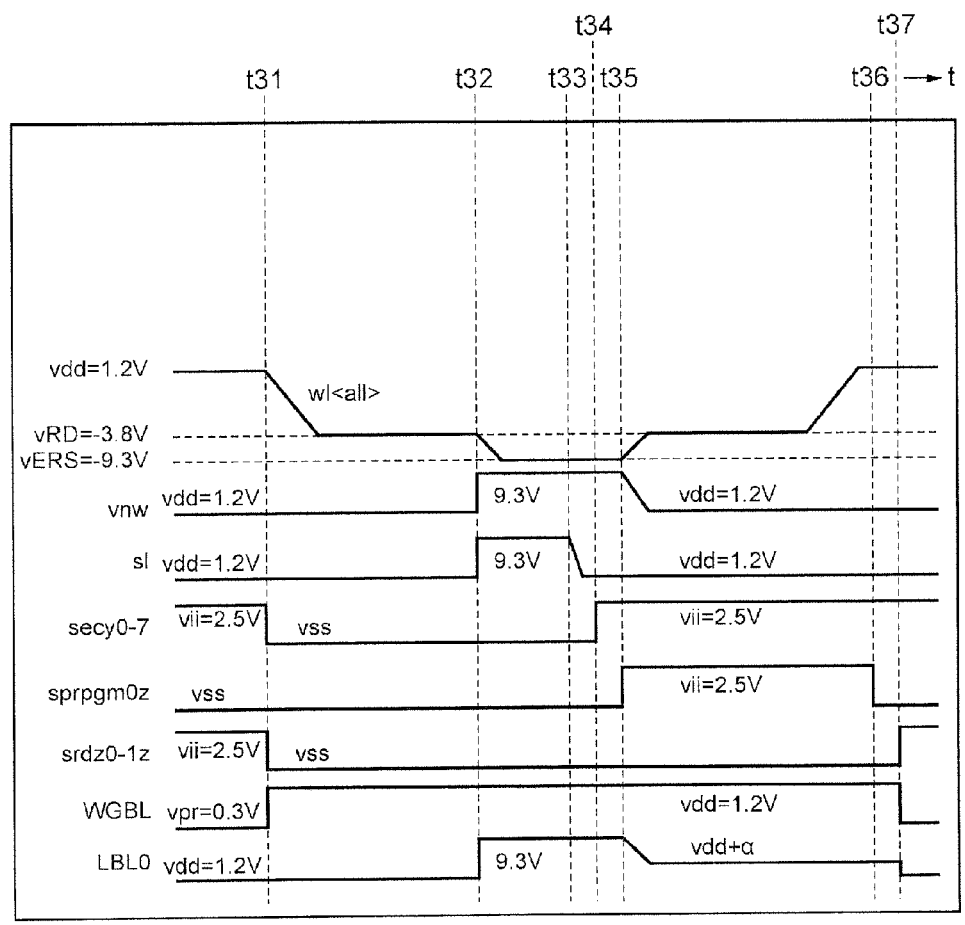
FIG. 14 is a diagram showing an example of erase operation waveforms in an embodiment.

FIG. 14 is a diagram showing an example of erase operation waveforms. The following describes the erase operation waveform example shown in FIG. 14, separately at timings t31 to t37, according to an embodiment.

t31: srdz0z to srdz1z and secy0 to secy7 are closed. All word lines are connected to vss.

t32: The WL is decreased to an erase WL voltage (−5 V to −9 V). vnw (N-well) is increased to 9.3 V. sl is increased to 9.3 V, to start an erase pulse application.

t33: After the erase pulse application ends, sl is slowly discharged, in order to prevent WL withstand voltage violation due to coupling.

t34: After the discharge of sl is completed, secy0 to secy7 are all set to vii beforehand, so as not to cause hot switch during discharge.

t35: The word line and vnw (N-well) are discharged. All word lines are reset to vdd, and sprpgm0z is set to a logical high level to discharge the voltage of the LBL to the WGBL (up to vdd+α).

t36: sprpgm0z is set to a logical low level.

t37: Return to standby. The LBL is reset to vdd.

Embodiments herein describe examples of a p-channel floating-gate flash memory which has a small cell current during write per bit and is suitable for batch writing of multiple bits. However, the embodiments are not limited to this cell system, and the same structure is applicable to any flash cell system with a small cell current during write.

As described above, according to an embodiment, an increase in device area can be prevented while the number of WGBLs is increased to support batch writing, in a rewritable nonvolatile memory such as p-channel floating-gate flash memory.

In an embodiment, two or more LBLs are input to the NAND circuit in the local S/A, where the elements corresponding to the respective LBLs differ in drive capability in the NAND circuit. Moreover, in an embodiment, multivalued data is assigned according to the output transition speed of the NAND circuit, and the RGBL transmits multivalued data. The number of RGBLs and the number of local S/As may be reduced in this way.

Figure 3:
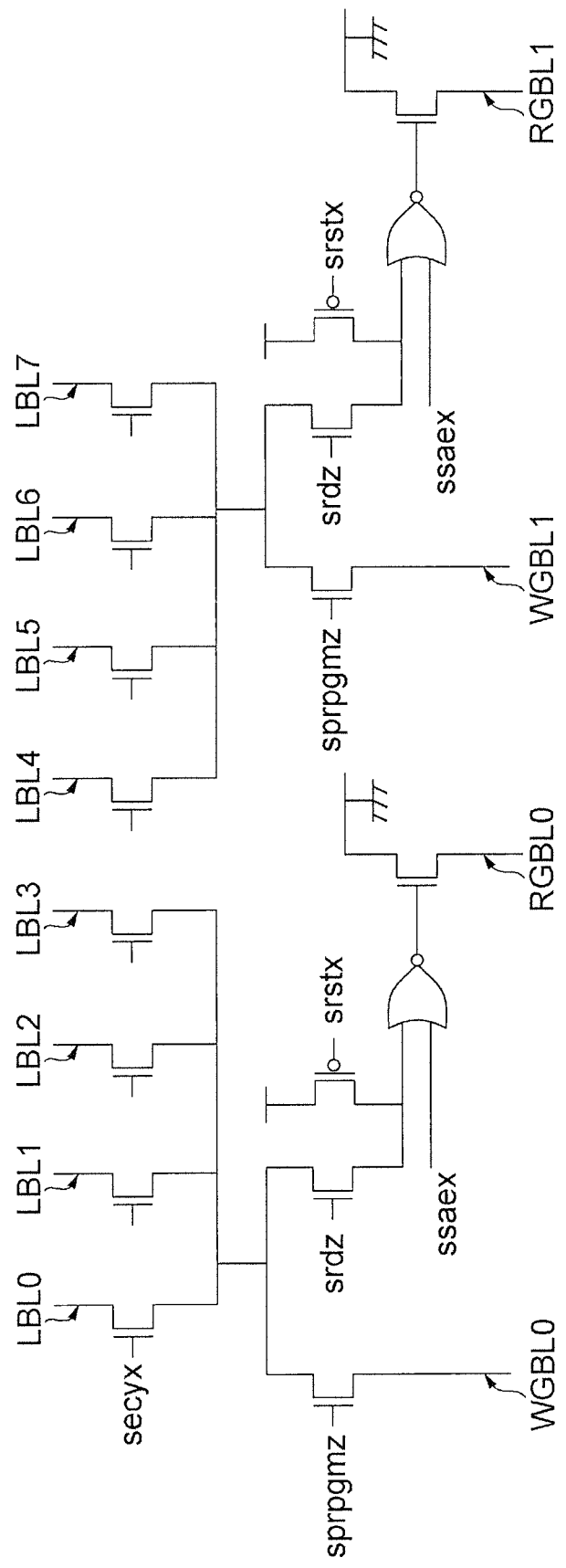
FIG. 3 is a diagram showing a structural example of local sense amplifiers and bit lines in the flash memory.

Furthermore, in an embodiment, the number of WGBLs is four (twice the two WGBLs shown in FIG. 3) to enable batch writing of multiple bits, while the number of RGBLs is ¼ the number of WGBLs. The number of GBLs for eight LBLs can thus be reduced from 4 to 2.5 (−37.5%), as compared with the case where the number of GBLs is simply doubled as shown in FIG. 3. In an embodiment, the number of read global bit lines can be set to not more than ¼ the number of write global bit lines.

Therefore, embodiments as described herein may reduce the data bus area and the S/A area while ensuring high-speed write throughput.

In addition to an increase in device area, the conventional techniques also have a problem in that, even in the case where the internal boost power supply is able to supply the total cell current during batch writing of multiple bits, the number of GBLs in the cell array limits the bit width that can be written at once. As a result, the time for writing a large amount of data increases.

The conventional techniques also have a problem in that, since the number of times a word line needs to be selected in order to write to a cell connected to the word line increases, more program disturb occurs in a cell that is not written. The conventional techniques further have a problem in that the number of local S/As increases and so the macro size increases.

In view of these problems, according to an embodiment, more bits can be written at once and therefore the time for writing a large amount of data can be reduced, while preventing an increase in macro size.

Moreover, given that the number of times a word line needs to be selected in order to write to a cell connected to the word line increases, program disturbances in a cell that is not written are reduced. This improves reliability in data retention and the number of rewrites.

The advantageous effects mentioned above are not limited to p-channel floating-gate flash memory, as the same advantageous effects can be achieved in all types of rewritable nonvolatile memory. For example, in nonvolatile memory with a smaller memory cell area such as a PCRAM or a ReRAM, the influence of the data bus and S/A area on the chip size is relatively high. Applying the structure of this embodiment to reduce the data bus and S/A area, however, produces remarkable advantageous effects.

Though one aspect of the semiconductor device according to the present invention has been described above by way of an embodiment, this is merely an example, and the present invention is not limited to the above description. For example, the 2nd amp may transfer 3-bit data as multivalued data through the RGBL, using eight transfer timings.

It is to be appreciated that the Detailed Description section, and not the Summary and Abstract sections (if any), is intended to be used to interpret the claims. The Summary and Abstract sections (if any) may set forth one or more but not all exemplary embodiments of the invention as contemplated by the inventor(s), and thus, are not intended to limit the invention or the appended claims in any way.

While the invention has been described herein with reference to exemplary embodiments for exemplary fields and applications, it should be understood that the invention is not limited thereto. Other embodiments and modifications thereto are possible, and are within the scope and spirit of the invention. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

References herein to "one embodiment," "an embodiment," "an example embodiment," or similar phrases, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein.

The breadth and scope of the invention should not be limited by any of the above-described exemplary embodiments, but should be defined only in accordance with the following claims and their equivalents.

What is claimed is:

1. A semiconductor device comprising:
   a plurality of memory cells;
   a plurality of local bit lines connected to respective memory cells of the plurality of memory cells; and
   a first amplifier configured to:
      receive read data from each local bit line of the plurality of local bit lines,
      determine a transition speed of an output level of the first amplifier in response to receiving a combination of at least two pieces of read data, and
      transfer multivalued data of the read data to a read global bit line based on the determined transition speed.

2. The semiconductor device according to claim 1, wherein the first amplifier comprises:
   a NAND circuit that receives input of the read data from two or more local bit lines of the plurality of local bit lines, and
   wherein the first amplifier is configured to determine the transition speed based on the combination of the at least two pieces of read data and a difference between drive capabilities of elements of the NAND circuit.

3. The semiconductor device according to claim 1, wherein a number of read global bit lines is less than or equal to a quarter of a number of write global bit lines.

4. The semiconductor device according to claim 1, further comprising:
   a second amplifier configured to encode the multivalued data to binary data by detecting a difference in the transition speed.

5. The semiconductor device according to claim 4, wherein the second amplifier comprises:
   a plurality of read amplifiers that are connected to the read global bit line, and are configured to sense the read global bit line at respective different timings, and
   wherein the second amplifier is configured to perform an encode process based on a sensing result of the plurality of read amplifiers.

6. The semiconductor device according to claim 5, wherein, when the number of write global bit lines is more than the number of read global bit lines and when a plurality of bits are written at once by using the write global bit lines, the second amplifier is configured to perform a series of processes from a precharge of the local bit lines to the encode process repeatedly until the plurality of bits are read.

7. A method for transferring data in a semiconductor device comprising a plurality of memory cells and a plurality of local bit lines connected to respective memory cells of the plurality of memory cells, the method comprising:
   receiving read data from each local bit line of the plurality of local bit lines;
   determining a transition speed of a data output level in response to receiving a combination of at least two pieces of read data; and
   transferring, based on the determined transition speed, multivalued data of the read data to a read global bit line.

* * * * *